United States Patent [19]

Iacoponi

[11] Patent Number: 4,723,244

[45] Date of Patent: Feb. 2, 1988

[54] METHOD AND APPARATUS FOR PRESERVING THE INTEGRITY OF THE ERROR DETECTION/CORRECTION WORD IN A CODE WORD

[75] Inventor: Michael J. Iacoponi, Indian Harbor Beach, Fla.

[73] Assignee: Harris Corporation, Melbourne, Fla.

[21] Appl. No.: 782,347

[22] Filed: Oct. 1, 1985

[51] Int. Cl.⁴ .............................................. G06F 11/10
[52] U.S. Cl. ........................................ 371/37; 371/22; 370/86
[58] Field of Search ............... 371/37, 22, 49; 370/86, 370/79, 88, 89; 340/825.05, 825.06, 825.16

[56] References Cited

U.S. PATENT DOCUMENTS

| | | | |
|---|---|---|---|
| 3,872,430 | 3/1975 | Boudreau | 371/37 |
| 4,393,497 | 7/1983 | Cantwell | 370/89 |
| 4,577,313 | 3/1986 | Sy | 371/37 X |

*Primary Examiner*—Jerry Smith
*Assistant Examiner*—Robert W. Beausoliel, Jr.
*Attorney, Agent, or Firm*—John L. DeAngelis, Jr.

[57] ABSTRACT

An apparatus and method for use in a communications system to modify a check word associated with a data word to retain the integrity of the former when the latter has been changed at a node in the system. When binary symbols are used, the received data word and the modified data word are combined on a serial bit-by-bit basis in a first exclusive OR gate. The result is encoded using the same coding scheme as used with the received data and check words. The encoded signal and the received check word are provided as an input to a second exclusive OR gate on a bit-by-bit basis. The signal produced by the second exclusive OR gate is the modified check word; the modified check word is then appended to the modified data word for transmission over the network. The entire process can be carried out on a bit-by-bit basis, allowing information to be relayed through a network node with minimal delay.

30 Claims, 3 Drawing Figures

METHOD AND APPARATUS FOR PRESERVING THE INTEGRITY OF THE ERROR DETECTION/CORRECTION WORD IN A CODE WORD

This invention was made with Government support under Contract No. F 336115-83-C-1012 awarded by the U.S. Air Force/Air Force Wright Aeronautical Laboratories. The Government has certain rights in this invention.

FIELD OF THE INVENTION

This invention relates to a method and apparatus for preserving the integrity of the error detection/correction word (i.e., the check word) in a code word, when the data word (i.e., information portion of the code word) has been intentionally changed during transmission from a source node to a destination node.

BACKGROUND OF THE INVENTION

Computers and data terminals operate on information in digital form. The process of converting information into its binary equivalent is called "coding" or "encoding". A decimal number can be coded as a pure binary number or with a code based upon the binary number system. In the pure binary code, every decimal number is translated to its equivalent in the binary number system. Perhaps the most widely used code for converting decimal numbers to binary form is the binary coded decimal (BCD) code. The BCD code combines some of the characteristics of both the binary and decimal number systems. The BCD code is a system of representing the decimal digits zero through nine with a four-bit pure binary word. The BCD code uses the standard 8421 position weighting system of the pure binary code. As with the pure binary code, a BCD number can be converted into its decimal equivalent by simply adding together the weights of the bit positions where binary ones occur. To represent a decimal number in BCD notation, the appropriate four-bit code is substituted for each decimal digit. For example, the decimal integer 83 in BCD is 1000 0011.

Another well-known coding scheme is the ASCII code (American Standard Code for Information Interchange). This is a special binary-based code widely used in microprocessors and data communications equipment, especially in transferring data between microprocessors and peripheral devices. ASCII is a seven-bit code and therefore can represent $2^7 = 128$ different characters. The upper and lower case alphabet, various mathematical and textual symbols, and special computer commands are assigned specific bit representations in the ASCII code.

Another widely-used code for coding digital numbers is the Gray code. The Gray code is a non-weighted code system, and is also a cyclic code. A cyclic code is one in which any code word can be shifted one bit left or right, and the result will always be another valid code word. Each left shift or right shift produces a legitimate code word representing a different symbol. Note that cyclic codes are a subclass of linear codes; that is, all cyclic codes are linear codes, but the converse is not true. Another characteristic of the Gray code is that there is a change in only one bit from one code word to the next one in sequence. Thus, the Gray code permits code circuitry to operate at higher speeds with fewer errors. The disadvantage of the Gray Code is its inapplicability to arithmetic computations. To perform arithmetic operations, a number coded with the Gray code must be converted into pure binary form. Further information regarding the Gray code can he found in the *Electronic's Engineer's Handbook*, Second Edition, by Donald G. Fink and Donald Christiansen, 1982 at page 23-20.

The coding schemes discussed above are typically used to encode letters, numbers, and symbols by various configurations of binary one's and zero's. These codes do not contain features that ensure data integrity in a computer system or network of data terminals. Internal and external data transmissions within and between computers and data terminals occurs continuously and at high speed. Imperfections in the transmission channels and failures within the communicating devices inevitably produce some erroneous data, and it is therefore desirable to detect and correct such errors whenever they occur. The basic premise for error detection and correction is to design a code in which each word contains more bits than are needed to represent all the symbols in the data set, i.e., more bits than are necessary to simply transmit the information. The extra bits provide information for error correcting and/or detecting. If a received bit sequence is not among those assigned to data or information symbols, an error is known to have occurred.

One such commonly used error-detection code is the parity check. Assume that eight bits are used to represent data and an additional bit is reserved as a check bit. A simple electronic circuit can determine whether an even or odd number of one bits is included in the eight bit positions. If odd parity is chosen, and there are an even number of one bits, a one bit can be inserted in the check-bit position. If an odd number of one bits exist, a zero is placed in the check position. As a result, all transmitted code words will have an odd number of one bits. If the received nine-bit sequence contains an even number of one bits, an error occurred. There are limitations in the use of the simple parity scheme as a mechanism for error detection, since in many transmission channels and storage systems there is a tendency for a failure to produce simultaneous bit errors in two adjacent positions. This type of error would not be detected since the parity of the word remains unchanged. Also, the parity scheme does not provide error correction.

Any data stream can be coded with a linear code (for example, Reed-Solomon, BCH, Hamming, or general polynomial codes) to provide error detection and correction. This is accomplished by appending a check word to the data stream representing the information, i.e., the data word. To generate the check word a function G(x) is "divided" into the data word, the quotient is discarded, and the remainder forms the check word. In the subtract portion of the division operation, the remainder is obtained through an XOR (exclusive OR) operation rather than by legitimate subtraction. Therefore, any G(x) will "divide" into another number with an equal number of digits one time regardless of whether G(x) is larger or smaller than the dividend.

An example of this technique is illustrated below for a linear polynomial code using the binary system for the polynomial coefficients (symbols); this technique is well known in the coding art. Assume a generating polynomial $$G(x) = x^5 + x^4 + x + 1$$

and a data stream 10110111. The message polynomial formed by this data stream is:

$$M(x) = x^7 + x^5 + x^4 + x^2 + x + 1$$

Note the most significant bit in M(x) is on the left. To produce the check word, M(x) is multiplied by the number of bits in the check word, which is the same as the highest order of G(x). The result is shown below.

$$x^5(x^7+x^5+x^4+x^2+x+1) = x^{12}+x^{10}+x^9+x^7+x^6+x^5 = 1011011100000$$

The result is divided by G(x).

```
              1 1 0 1 0 1 1 1  (discarded)
110011 )1011011100000
        110011
         111101
         110011
          111010
          110011
           100100
           110011
            101110
            110011
             111010
             110011
              01001  = check word
```

The check word is appended to the message producing a transmitted bit stream of

1011011101001

At the receiver the transmitted bit stream is "divided" by the same G(x), and if the remainder is zero there is no error in the received code word.

```
              1 1 0 1 0 1 1 1
110011 )1011011101001
        110011
         111101
         110011
          111010
          110011
           100110
           110011
            101010
            110011
             110011
             110011
              000000  No Error
```

The Hamming code is a well-known linear code. The Hamming code is also a forward error-correcting code, meaning that a device receiving information in Hamming code form has the capacity to detect and correct some errors in the received transmission. Hamming bits are bits placed anywhere in the string of informational bits, to allow the receiver to detect and correct a limited number of errors. Of course, use of the Hamming code for error detection and correction involves the transmission of additional bits, that is, bits in excess of those representing the information to be transmitted. Additional details regarding the Hamming code can be found in the *Digital and Data Communications* by Vincent F. Alisouskas and Wayne Tomasi, 1985 at pages 53–55.

One well-known application for the data codes discussed above is a data network, where several computers or data terminals, each located at a node of the network, are communicating with each other over the network. Typically, the information is transmitted in packets, each packet comprising one or more code words; each code word can range in length from a few bits to thousands of bits, depending on the application. Each code word may include an address header, a data word, and a check word. Noise on the network or within the communicating devices can distort bits in a transmitted word, causing the receiving device to interpret the word incorrectly. Thus the various error detecting and correcting techniques are used to provide reliable data communications over the network.

When the network is arranged in a ring fashion, it is necessary for a communicating device at a source node to communicate with a communicating device at a destination node via each intervening node in the ring. In such a communicating scheme each code word includes an address header indicating in some way, the communicating device for which the information is intended. For example, the address header may contain the address of the destination node. As the code word moves around the ring each communicating device checks the address header to determine if the information has reached its intended destination. If the information has not reached its destination it is transmitted farther along the ring. Generally, at each intervening node the code word is simply retransmitted without any change to its contents. In some applications, however, it may be desirable for an intervening node to change the code word before retransmission, for instance to signal an interrupt request. Alternatively, if a count representing the number of nodes to pass through before reaching the destination is placed in the address header, each node decrements the count and passes on the new header until the destination node is recognized by an all-zero header. These addressing schemes are both well-known techniques for communicating data within a ring network.

In the latter communication scheme where the address is changed at each node, the check-word scheme discussed above cannot be used because when a communicating device receives an information signal and changes the address portion thereof for transmission to the next device in the ring, the check word looses its validity. Once the code word (i.e., including the address header) has been changed, the analysis of the check word at the receiving terminal (as shown above) cannot reveal the occurrence of an error. It is possible to avoid this problem by using a store and forward technique. With this approach the receiving device captures and stores the entire code word, checks the address header and recognizes that it is not intended for this communicating device, changes the address, detects and/or corrects errors in the data word, recalculates the check word for the code word, and transmits the code word to the next node. This is a slow technique, especially because it has to be performed at each intervening node, and not desirable for use on high-speed data networks where each code word can be ten, hundreds, or even thousands of bits long. Also, once the data word and check word have been changed at a node, any previous errors in the data word must be detected and corrected at this node, because it is not possible to reflect these previous errors in the modified check word without additional coding, which complicates the scheme considerably. Probability theory teaches that there is a relatively low probability for errors to develop between two successive nodes, so it is inefficient to decode and recode the data and check words and detect and/or correct errors in the data word at each node.

SUMMARY OF THE INVENTION

It is an objective of the present invention to provide an apparatus and method for changing the error detection/correction check word portion of a code word in accord with certain changes made in the data word portion of the code word. This preserves the integrity of the check word vis-a-vis the data word so that intentional changes (i.e., non-error changes) in the data word do not destroy the validity of the check word. The present invention accomplishes this with minimum latency, because it is necessary to store only one code symbol (i.e., for a binary system, one bit) at each node where the data word and check word are modified. The check word modification is done in such a way so as to preserve the integrity of the check word, i.e., if an error occurred in the data word the modified check word will reflect this so that the error can be detected at its final destination, and if there were no errors in the data word, this will also be reflected by the new check word.

In a preferred embodiment, the present invention utilizes an exclusive OR function (for a binary system) to compare each bit in the received data word with each bit in the changed data word that is to be transmitted. The result of this exclusive OR (XOR) operation is then encoded with an encoding scheme identical to that used for encoding the source information into the data word. The result from the encoding process is then combined with the received check word in an exclusive OR operation. The result, on a bit-by-bit basis is the new check word.

BRIEF DESCRIPTION OF THE DRAWINGS

The present invention may be better understood, and the further advantages and uses thereof more readily apparent when considered in view of the following detailed description of exemplary embodiments, taken with the accompanying drawings in which.

DESCRIPTION OF THE PREFERRED EMBODIMENTS

Figure 1:
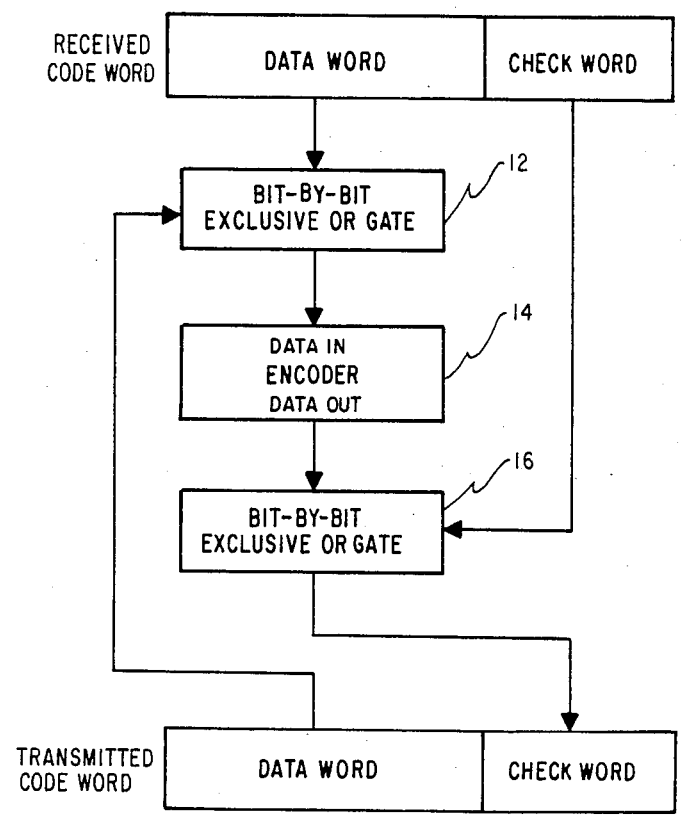
FIG. 1 illustrates the operation and structure of the present invention in representational form.

A received code word and a transmitted code word are shown in representational form in FIG. 1. Each code word comprises a data word and a check word as indicated. Each data word and code word comprises a predetermined number of bits, depending on the code chosen. The characters assembled to form the data words and check words (i.e., the symbols) can be the well-known binary digits or any other characters that are interpreted as defining a valid word.

For the present invention to function as intended, it is necessary that the code used to form the data words and check words be linear. A linear code is one that satisfies the following relationship, where F(z) represents the mapping function (that is, data z from a source is encoded by applying the function F to z)

$$F(a+b) = F(a) + F(b).$$

The present invention will function properly with any code that satisfies the above relationship where "+" is a mathematical operation over the field of numbers for a code symbol.

The present invention is advantageously used where a node in a ring data network receives a code word and must change one or more bits in the data portion of the code word to produce the transmitted code word. For example, it might be necessary for the address portion of the data word to be changed so that the received code word can be transmitted to the next node in the ring, or for the address portion to be decremented before retransmission. It might be necessary for the receiving node to change an interrupt bit in the received code word to signify that there is a message at the receiving node requiring immediate transmission to other nodes in the network. In any case, when the data word is changed at the receiving node, the integrity of the check word is lost; the nature of this change is not relevant to the present invention. The check word no longer can be used to indicate the occurrence or the correction of an error in the data word.

To preserve the integrity of the check word in the received code word, a symbol-by-symbol exclusive OR gate 12 is responsive to each bit of the data word of the received code word and the corresponding bits of the transmitted code word. (The exclusive OR operation is used when the code symbols are binary bits; in general the operation to be performed on the code symbols is serial symbol-by-symbol subtraction.) The transmitted data word differs from the received data word by one or more bits as changed in some fashion by the receiving device. The result from the exclusive OR gate 12 is provided as an input to an encoder 14. The encoder 14 encodes the signal provided as an input thereto (in a bit-by-bit fashion) using the same coding scheme as used to form the data words from the source information. The encoded signal from the encoder 14 is bit-by-bit combined with the received check word in a bit-by-bit exclusive OR gate 16. The resulting pattern from the exclusive OR gate 16 forms the transmitted check word. There is a one symbol delay between the received code word and the transmitted code word and all operations are performed on a symbol serial basis. Exclusive OR gates are used in conjunction with a binary representational code for the data and check words. If the data and check words are encoded with a different number system, the exclusive OR gates 12 and 16 would be replaced by an apparatus for performing subtraction over the field of numbers used to construct the code symbols.

The transmitted check word preserves the relationship between the received check word and the received data word. Any errors in the received data word, as determined by the received check word, will also be indicated in the transmitted check word. Any errors in the received data word or check word will be in the same position in the transmitted code word. Hence, a received code word is mapped to another code word having a different data word in the absence of errors, and an erroneous received data word is mapped into a different erroneous data word with the original errors untouched. This ensures that while the received data word has changed, and possibly had errors in it, the error structure of the transmitted code word is identical to the error structure of the received code word.

There are other known techniques whereby any errors in the received code word can be detected and/or corrected before transmission. However, the advantages associated with the present invention are: (a) implementation with few gates, (b) a short pipeline delay between the time the code word is received and the new code word is transmitted (one bit or symbol), and (c) protection characteristics of the code are preserved.

Figure 2:
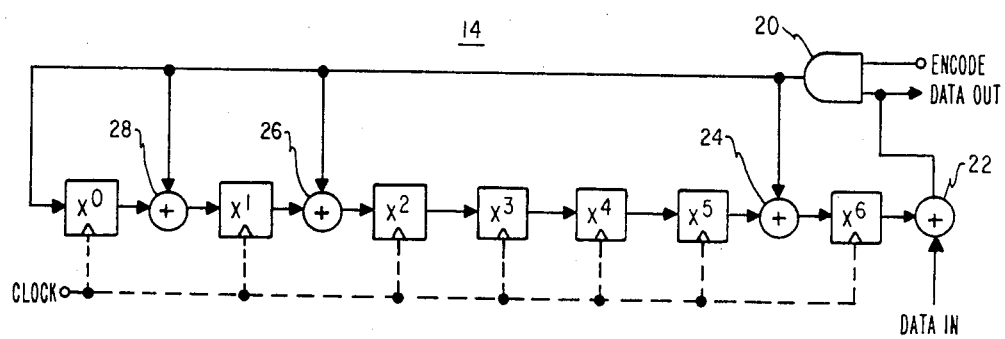
FIG. 2 is a detailed block diagram of the encoder shown generally in FIG. 1.

FIG. 2 is a block diagram implementation of the encoder 14 of FIG. 1. The structure of the encoder 14 is well-known in the art and will not be discussed in detail here. The encoder 14 implements a polynomial code having a generating function $G(x)=x^7+x^6+x^2+1$. To encode the serial string of bits from the exclusive OR gate 12 shown in FIG. 1, the encode terminal is set to a high level to enable an AND gate 20. Flip-flops $x^0$ through $x^6$ are cleared. Bits are input at the "Data In" terminal to an exclusive OR gate 22. The encoded data is sent through the AND gate 20. The data is simultaneously sent out to be transmitted. The output signal from the AND gate 20 is provided to exclusive OR gates 24, 26, and 28. After all the bits have been input to the encoder 14 the encode terminal is pulled low and the feedback path is disabled. The contents of the encoder 14, representing the check word, are then shifted out through the "Data Out" terminal and transmitted.

Figure 3:
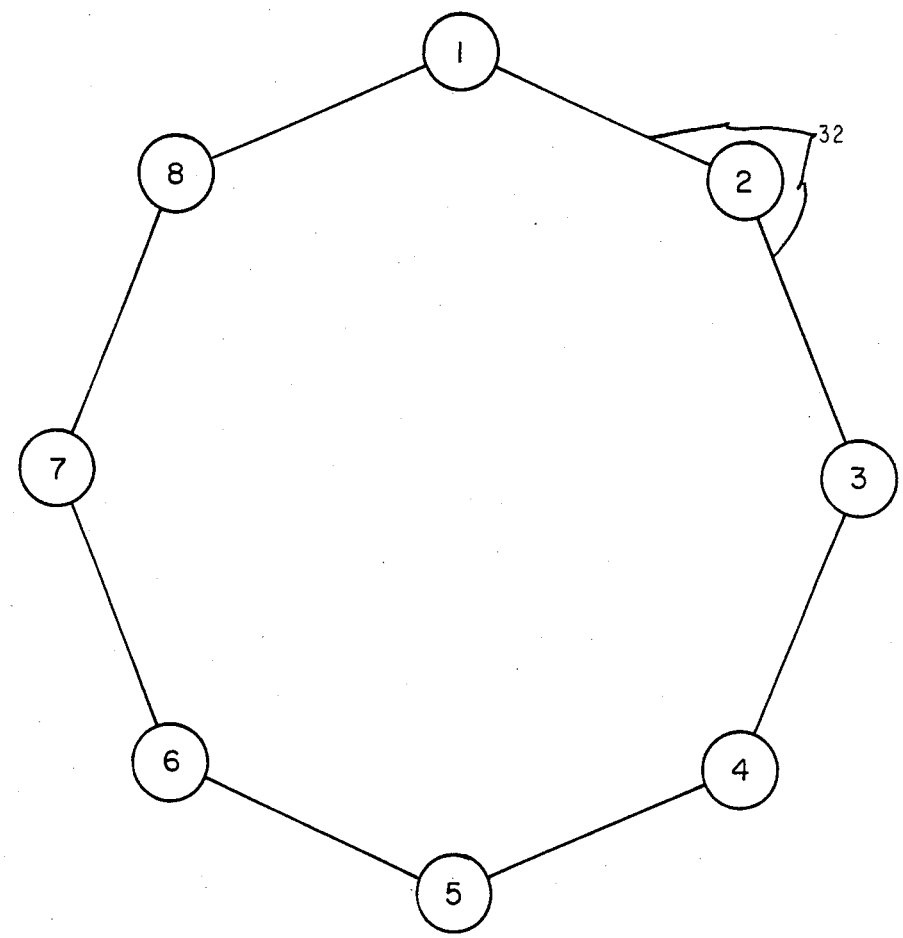
FIG. 3 is a block diagram of a ring network suitable for use with the present invention.

A ring communications network 30 and eight nodes (1–8) are shown in FIG. 3, with interconnecting communications paths designated generally by reference character 32. At each node in FIG. 3 there would be located bit-by-bit exclusive OR gates, such as the bit-by-bit exclusive OR gates 12 and 16 in FIG. 1, and an encoder, such as the encoder 14 in FIG. 1. (Again, this assumes the code symbols are the binary numbers 1 and 0.) The received code word at each node would be processed as discussed above to form the transmitted code word.

While I have shown and described several embodiments in accordance with the present invention, it is understood that the same is not limited thereto but is susceptible of numerous changes and modifications as known to a person skilled in the art, and I therefore do not wish to be limited to the details shown and described herein, but intend to cover all such changes and modifications as are obvious to one of ordinary skill in the art.

What is claimed is:

1. In a communication system wherein information is transmitted in the form of a data word representing the information and a check word for error detection, wherein the data word and the check word each include a plurality of code symbol groups, and wherein symbol groups of a received data word are processed at a node of the communications system to produce symbol groups of a modified data word, an apparatus for producing a modified check word to conform with the modified data word, said apparatus comprising:
   first means for processing a symbol group of the receiving data word and a symbol group of the modified data word after said modified data word symbol group is produced and for producing a comparison symbol group in response thereto;
   means for encoding said comparison symbol group to produce an encoded symbol group;
   second means for processing said encoded symbol group and a symbol group of the received check word after said encoded symbol group is produced, to produce a symbol group of the modified check word.

2. The apparatus of claim 1 wherein the received and the modified check words provide error detection and correction.

3. The apparatus of claim 1 wherein the first means processes the received data word symbol group and the modified data word symbol group by performing serial symbol subtraction on each symbol of the received and the modified data words to produce each symbol of the comparision symbol group, and wherein the subtraction is performed over the field of numbers used to construct the code symbols.

4. The apparatus of claim 1 wherein when the symbols of the data and the check words are binary numbers the first means includes an exclusive OR gate having a first input terminal responsive to each symbol of the received data word symbol group and a second input terminal responsive to each symbol of the modified data word symbol group, wherein each symbol of the comparison symbol group is available at the output terminal thereof, wherein said exclusive OR give performs the exclusive OR function on a bit-by-bit serial basis to produce each symbol of the comparison symbol group at the output terminal thereof.

5. The apparatus of claim 1 wherein the means for encoding each symbol of the comparison symbol group using the same encoding scheme as used for the data and the check words.

6. The apparatus of claim 1 wherein the second means performs serial symbol subtraction on each symbol of the encoded symbol group and each symbol of the received check word symbol group to produce each symbol of the modified check word symbol group, and wherein the subtraction is performed over the field of numbers used to construct the code symbols.

7. The apparatus apparatus of claim 1 wherein when the symbols of the data and the check words are binary numbers the second means includes an exclusive OR gate having a first input terminal responsive to each symbol of the encoded symbol group, and a second input terminal responsive to each symbol of the received check word symbol group for performing the exclusive OR function on a bit-by-bit serial basis to produce each symbol of the modified check word symbol group at the output terminal thereof.

8. The apparatus of claim 1 wherein the encoding scheme for the data and the check words is a linear code scheme, wherein liner is defined by $F(a+b)=F(a)+F(b)$, wherein "+" indicates a mathematical operation over the field of numbers for a code symbol.

9. The apparatus of claim 1 wherein the received data word symbol group, the modified data word symbol group, the comparison symbol group, the encoded symbol group, and the modified check word symbol group each include a single code symbol.

10. The apparatus of claim 9 wherein the received and the modified check words provide error detection and correction.

11. The apparatus of claim 9 wherein when the data and the check words are binary numbers the first means includes an exclusive OR gate having a first input terminal responsive to the received data word and a second input teminal responsive to the modified data word, for performing the exclusive OR function on a bit-by-bit serial basis to produce the comparison signal at the output terminal thereof.

12. The apparatus of claim 9 wherein when the data and the check words are binary numbers the second means includes an exclusive OR gate having a first input terminal responsive to the encoded signal, and a second input terminal responsive to the received check word, for performing the exlusive OR function on a bit-by-bit serial basis to produce the modified check word at the output terminal thereof.

13. The apparatus of claim 9 wherein the encoding scheme for the data and the check words is a linear code scheme, wherein linear is defined by $F(a+b)=F(a)+F(b)$, wherein "+" indicates a mathematical operation over the field of numbers for a code symbol.

14. In a communications system wherein information is transmitted in the form of a data word representing the information and a check word for error detection and wherein the data word and the check word each include a plurality of code symbol groups, and wherein a symbol group of the received data word is processed when received at a node of the communications system, to produce a symbol group for a modified data word, a method for modifying the check word to conform with the modified data word, said method including the steps of:
(a) processing each symbol group of the received and the modified data words as each symbol group of the modified data word is produced and producing a comparison symbol group in response thereto;
(b) encoding said comparison symbol group to produce an encoded symbol group;
(c) processing said encoded symbol group and a symbol group of the received check word after said encoded symbol group is produced to produce a symbol group of the modified check word.

15. The method of claim 14 wherein the received and the modified check words provide error detection and correction.

16. The method of claim 14 wherein step (a) includes performing serial symbol subtraction on each symbol of the received data word symbol group and each symbol of the modified data word symbol group to produce each symbol of the comparison symbol group, and wherein the subtraction is performed over the field of numbers used to construct the code symbols.

17. The method of claim 14 wherein step (b) includes encoding each symbol of the comparison symbol group using the same encoding scheme as used for the data and the check word.

18. The method of claim 14 wherein step (c) includes performing serial symbol subtraction on each symbol of the encoded symbol group and each symbol of the received check word symbol group to produce each symbol of the modified check word symbol group, and wherein the subtraction is performed over the field of numbers used to construct the code symbols.

19. The method of claim 14 wherein the encoding scheme for the data and the check words is a linear code scheme, wherein linear is defined by $F(a+b)=F(a)+F(b)$, wherein "+" indicates a mathematical operation over the field of numbers for a code symbol.

20. The method of claim 14 wherein the received data word symbol group, the modified data word symbol group, the comparison symbol group, the encoded symbol group, and the modified check word symbol group each include a single code symbol.

21. A communications network, comprising:
a plurality of nodes, wherein information is transmitted between nodes in the form of a data word representing the information and a check word for error detection, wherein said data word and said check word include a plurality of code symbol groups;
wherein as a data word symbol group is received at a node, said symbol group is modified to produce a modified data word symbol group;
first means for processing said data word symbol group and said modified data word symbol group and for producing a comparison symbol group in response thereto;
means for encoding said comparison symbol group to produce an encoded symbol group;
second means for processing said encoded symbol group and said check word symbol group after each encoded symbol group is produced to produce a modified check word symbol group, wherein said modified check word symbol group conforms with said modified data word symbol group; and
wherein said modified data word symbol group and said modified check word symbol group are transmitted to another node.

22. The communications network of claim 21 wherein the received and the modified check words provide error correction and detection.

23. The communications network of claim 21 wherein the first means performs serial symbol subtraction on each symbol of the data word symbol group and each symbol of the modified data word symbol group to produce each symbol of the comparison symbol group, and wherein the substraction is performed over the field of numbers used to construct the code symbols.

24. The communications network of claim 21 wherein when symbols of the data and the check words are binary numbers the first means includes an exclusive OR gate having a first input terminal responsive to each symbol of the data word symbol group and a second input terminal responsive to each symbol of the modified data word symbol group, wherein each symbol of the comparison symbol group is available at the output terminal thereof, wherein said exclusive OR gate performs the exclusive OR function on a bit-by-bit serial basis to produce each symbol of the comparison symbol group at the output terminal thereof.

25. The communications network of claim 21 wherein the means for encoding encodes each symbol of the comparison symbol group using the same encoding scheme as used for the data and the check words.

26. The communications network of claim 21 wherein the second means performs serial symbol subtraction on each symbol of the encoded symbol group and each symbol of the check word symbol group to produce each symbol of the modified check work symbol group, and wherein the substraction is performed over the field of numbers used to construct the code symbols.

27. The communications network of claim 21 wherein when symbols of the data and the check words are binary numbers the second means includes an exclusive OR gate having a first input terminal responsive to each symbol of the encoded symbol group, and a second input terminal responsive to each symbol of the check word symbol group for performing the exclusive OR function on a bit-by-bit serial basis to produce each symbol of the modified check word symbol group at the output terminal thereof.

28. The apparatus of claim 21 wherein the encoding scheme for the data and the check words is a linear code scheme, wherein linear is defined by $F(a+b) = F(a) + F(b)$, wherein "+" indicates a mathematical operation over the field of numbers for a code symbol.

29. The communications network of claim 21 wherein the data word symbol group, the modified data word symbol group, the comparison symbol group, the encoded symbol group, the check word symbol group, and the modified check word symbol group each include a single code symbol.

30. In a communication system wherein information is transmitted in the form of a data word representing the information and a check word for error detection, and wherein a received data word is modified at a node of the communications system, an apparatus for modifying the check word to conform with the modified data word, said apparatus comprising:

first means for performing serial symbol-by-symbol substraction on the received and the modified data words to produce a comparison signal in response thereto;

means for encoding said comparison signal to produce an encoded signal, wherein said means for encoding uses the same encoding scheme as used to generate the received check word;

second means for performing serial symbol-by-symbol subtraction on the encoded signal and the received check word to produce the modified check word.

* * * * *